United States Patent
Han et al.

(10) Patent No.: US 10,381,544 B2
(45) Date of Patent: Aug. 13, 2019

(54) SYSTEM AND FABRICATION METHOD OF PIEZOELECTRIC STACK THAT REDUCES DRIVING VOLTAGE AND CLAMPING EFFECT

(71) Applicant: CTG Advanced Materials, LLC, Bolingbrook, IL (US)

(72) Inventors: Pengdi Han, New Castle, WA (US); Jian Tian, Naperville, IL (US); Stephen Dynan, Naperville, IL (US); Brandon Stone, Elgin, IL (US)

(73) Assignee: CTS Corporation, Lisle, IL (US)

( * ) Notice: Subject to any disclaimer, the term of this patent is extended or adjusted under 35 U.S.C. 154(b) by 472 days.

(21) Appl. No.: 15/308,819

(22) PCT Filed: May 6, 2015

(86) PCT No.: PCT/US2015/029414
§ 371 (c)(1),
(2) Date: Nov. 3, 2016

(87) PCT Pub. No.: WO2015/171726
PCT Pub. Date: Nov. 12, 2015

(65) Prior Publication Data
US 2017/0186937 A1    Jun. 29, 2017

Related U.S. Application Data

(63) Continuation-in-part of application No. 14/266,229, filed on Apr. 30, 2014, now Pat. No. 9,260,794, (Continued)

(51) Int. Cl.
*C30B 11/00* (2006.01)
*C30B 11/08* (2006.01)
(Continued)

(52) U.S. Cl.
CPC .......... *H01L 41/083* (2013.01); *C30B 11/001* (2013.01); *C30B 11/08* (2013.01); (Continued)

(58) Field of Classification Search
CPC ..... H01L 41/083; H01L 41/18; H01L 41/277; C30B 11/08; C30B 11/001; C30B 35/00; (Continued)

(56) References Cited

U.S. PATENT DOCUMENTS

| 6,942,730 B2 | 9/2005 | Han et al. |
| 7,908,722 B2 | 3/2011 | Han et al. |

(Continued)

FOREIGN PATENT DOCUMENTS

| EP | 2207215 A1 | 7/2010 | |
| WO | WO-2015/171726 A2 * | 12/2015 | ............. H01L 41/18 |

*Primary Examiner* — Thomas M Dougherty
(74) *Attorney, Agent, or Firm* — Daniel Deneufbourg

(57) ABSTRACT

A system and method provides a piezoelectric stack arrangement for reduced driving voltage while maintaining a driving level for active piezoelectric materials. A stack arrangement of $d_{36}$ shear mode <011>single crystals of both air X-cut and Y-cut ±1:45° (±20°) arrangement are bonded with discrete conductive pillars to form a shear crystal stack. The bonding area between the neighboring crystal parts is minimized. The bonding pillars are positioned at less than a total surface are of the single crystal forming the stack. The stack fabrication is facilitated with a precision assembly system, where crystal parts are placed to desired locations on an assembly fixture for alignment following the preset operation steps. With the reduced clamping effect from bonding due to lower surface coverage of the discrete conductive pillars, such a piezoelectric $d_{36}$ shear crystal stack exhibits a reduced driving voltage while maintaining a driving level and substantial and surprisingly improved performance.

23 Claims, 10 Drawing Sheets

Related U.S. Application Data which is a continuation-in-part of application No. 13/025,751, filed on Feb. 11, 2011, now Pat. No. 9,219,223.

(60) Provisional application No. 61/989,099, filed on May 6, 2014, provisional application No. 61/989,118, filed on May 6, 2014.

(51) Int. Cl.
  *C30B 29/22* (2006.01)
  *C30B 35/00* (2006.01)
  *H01L 41/18* (2006.01)
  *H01L 41/083* (2006.01)
  *H01L 41/277* (2013.01)

(52) U.S. Cl.
  CPC .............. *C30B 29/22* (2013.01); *C30B 35/00* (2013.01); *H01L 41/18* (2013.01); *H01L 41/277* (2013.01); *Y10T 117/10* (2015.01); *Y10T 117/1008* (2015.01); *Y10T 117/108* (2015.01); *Y10T 117/1024* (2015.01); *Y10T 117/1076* (2015.01); *Y10T 117/1092* (2015.01)

(58) Field of Classification Search
  CPC .............. Y10T 117/10; Y10T 117/1008; Y10T 117/1024; Y10T 117/1076
  USPC .......................... 310/358; 501/134; 252/62.9
  See application file for complete search history.

(56) References Cited

U.S. PATENT DOCUMENTS

| | | |
|---|---|---|
| 8,395,301 B1 | 3/2013 | Uchino et al. |
| 8,535,442 B2 | 9/2013 | Han et al. |
| 8,728,238 B2 | 5/2014 | Han et al. |
| 9,219,223 B2 | 12/2015 | Han et al. |
| 9,260,794 B2 | 2/2016 | Han et al. |
| 2006/0012270 A1* | 1/2006 | Han .................. H01L 41/183 310/358 |
| 2007/0216261 A1* | 9/2007 | Higuchi ............. H01L 41/187 310/358 |
| 2008/0309198 A1 | 12/2008 | Van Tol et al. |
| 2013/0211251 A1 | 8/2013 | Han et al. |

* cited by examiner

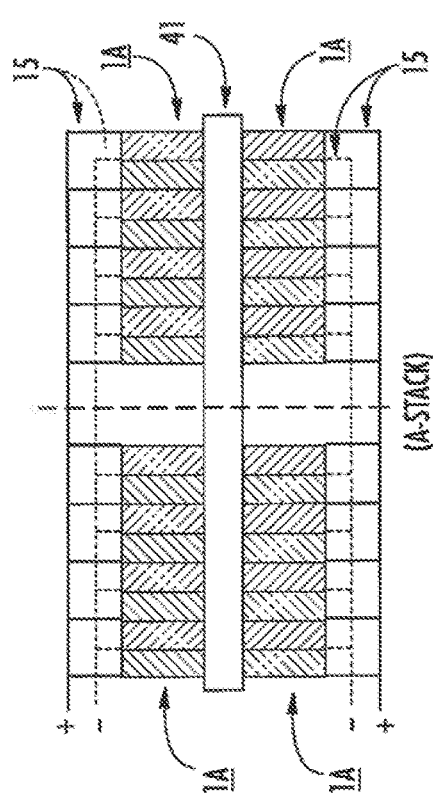
FIG. 10 (A-STACK)
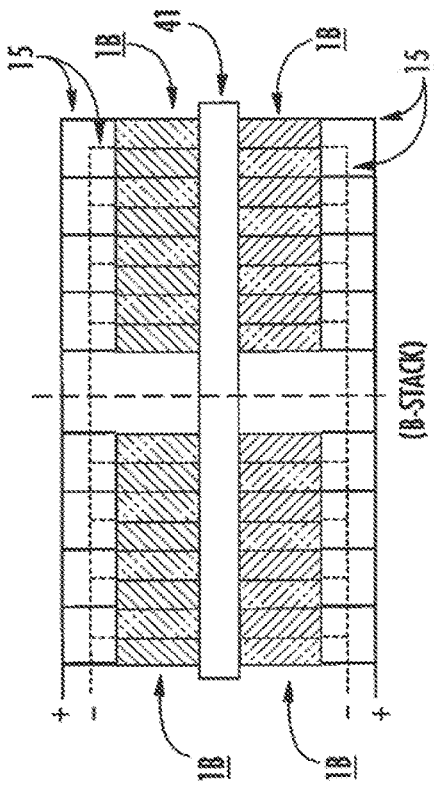
FIG. 11 (B-STACK)
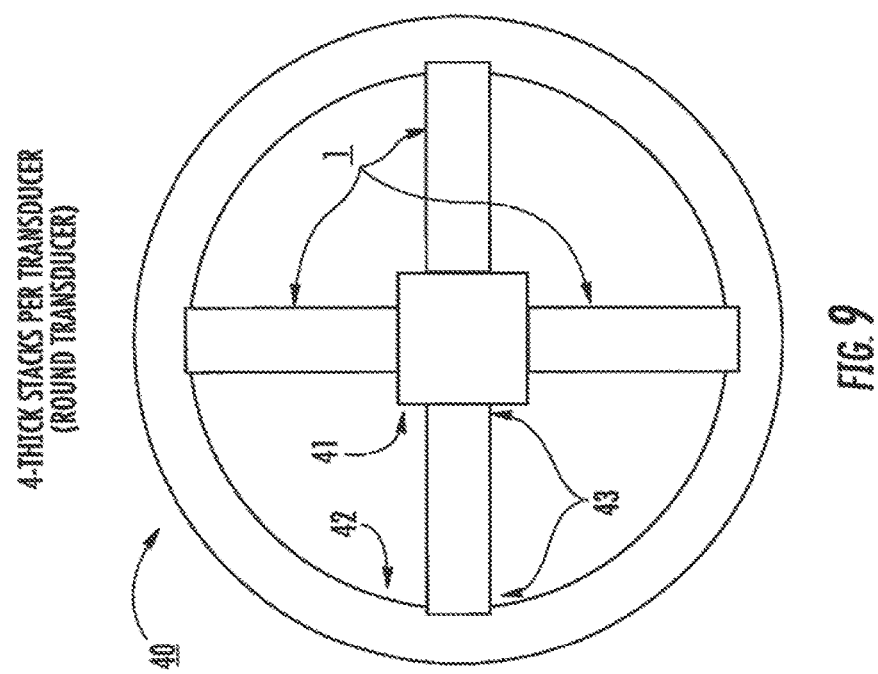
FIG. 9
4-THICK STACKS PER TRANSDUCER (ROUND TRANSDUCER)

SYSTEM AND FABRICATION METHOD OF PIEZOELECTRIC STACK THAT REDUCES DRIVING VOLTAGE AND CLAMPING EFFECT

CROSS REFERENCE TO RELATED APPLICATIONS

This application relates to and claims priority from U.S. Prov. Ser. No. 61/989,099 filed May 6, 2014 and U.S. Prov. Ser. No. 61/989,118 filed May 6, 2014, the entire contents of each are incorporated herein by reference.

This application also relates to and claims priority from International Application Serial No. PCT/US2015/029414 filed on May 6, 2015 the entire contents of which are incorporated herein by reference.

This application also relates to and is a continuation-in-part of, U.S. application Ser. No. 14/266,229, filed Apr. 30, 2014 and issued as U.S. Pat. No.9,260,794 on Feb. 16, 2016, which in turn is a continuation of and claims priority to U.S. application Ser. No. 13/957,074 filed Aug. 1, 2013 and issued as U.S. Pat. No. 8,728,238 on May 20, 2014, the entire contents of which are incorporated herein by reference; which claims priority to and is a continuation of U.S. application Ser. No. 12/373,080 filed Jan. 9, 2009, now U.S. Pat. No. 8,535,442 issued Sept. 17, 2013, which claims priority from PCT App. Ser. No. PCT/US07/073412 filed Jul. 12, 2007 which clams priority from U.S. Prov. App. Ser. No. 60/830,139, filed Jul. 12, 2006, the entire contents of each of which are herein incorporated by reference.

U.S. application Ser. No. 14/266,229, filed Apr. 30, 2014 and issued as U.S. Pat. No. 9,260,794 on Feb. 16, 2018 is also a continuation-in-part of U.S. application Ser. No. 11/205,875 filed Aug. 17, 2005 , which in turn claims priority as a continuation to U.S. application Ser. No. 10/288,042 filed Nov. 4, 2002, now U.S, Pat. No. 6,942,730 issued Sept. 13, 2005, and U.S. Prov. App. Ser. No. 60/330, 915 filed Nov. 2, 2001, the entire contents of each of which are herein incorporated fully by reference.

This application further relates to and is a continuation-in-part of, U.S. application Ser. No. 13/025,751 filed Feb. 11, 2011 and issued as U.S. Pat. No. 9,219,223 on Dec. 22, 2015, which is a continuation of and claims priority to U.S. application Ser. No. 12/252,037 filed Oct. 15, 2008 now issued as U.S. Pat. No. 7,908,722 on Mar. 22, 2011, which in turn is a continuation of and claims priority to U.S. Ser. No. 11/818,735 filed Jun. 15, 2015 , which in turn is a continuation of and claims priority to U.S. Ser. No. 11/1182, 704 filed Jul. 14, 2005 , which in turn claims priority form US Prov. Ser. No. 60/598,885 filed Jul. 10, 2004, the entire contents of each of which are herein incorporated fully by reference.

GOVERNMENT SPONSORSHIP

This invention was made, in part, with government support under N00014-12-C-0368 awarded by the Office of Naval Research. The government has certain its in the invention.

FIGURE SELECTED FOR PUBLICATION

FIG. 3

BACKGROUND OF THE INVENTION

Field of the Invention

The present invention relates to the field of piezoelectric crystals and piezoelectric crystal composites operating for high frequency as well as a system and method for a design and fabrication of piezoelectric stacks exhibiting reduced driving voltage while maintaining driving level for transducer applications. More particularly, the present invention provides a novel and improved system and method for designing and fabricating piezoelectric $d_{35}$ shear mode crystal stacks with improved performance in transducer arrangements, Description of the Related Art Conventionally, PMN-PT based piezoelectric single crystals have superior dielectric and piezoelectric properties compared to the traditional PZT ceramics. To more fully exploit the excellent properties of single crystals, crystal composite have been fabricated to improve electromechanical coupling coefficients and thus transducer performance characteristics.

For ultrasound transducers, the operating frequency is often but not exclusively inversely related to the thickness of the piezoelectric material. Thus, as targeted operating frequency increases, the thickness of the piezoelectric material decreases accordingly and this induces operative and electromechanical difficulties. On the other hand, an optimal aspect ratio has been attempted for the piezoelectric crystal pillars in order to maintain a high electromechanical coupling coefficient for piezoelectric composites as has been illustrated by the applicants related granted and pending applications.

A conventional piezoelectric stack is generally used to reduce the driving voltage while maintaining the same driving level/field. It is useful especially when piezoelectric materials are too thick to drive under normal conditions. A stack concept is commonly adopted in some transducer designs such as tonpilz transducers. Generally a thin solid metal shim piece is placed between two piezoelectric elements and bonded with conductive epoxy. The metal shim is mainly for electrical connection and completely covers each piezoelectric element. Such arrangements for tonpilz transducers typically only work in $d_{33}$ mode, wherein a clamping effect in general is not a major concern. Unfortunately as a severe detriment, using other modes is prohibited. Accordingly, there is a need to provide an improved method and system for stack design for a piezoelectric system that addresses a concern and provides improved efficiencies.

ASPECTS AND SUMMARY OF THE INVENTION

In one alternative aspect, the present invention provides a system and method for a piezoelectric stack that reduces driving voltage while maintaining driving level in the active piezoelectric materials. Specifically, d36 shear mode single crystals of both X-cut and Y-cut (to be discussed) are bonded with discrete conductive epoxy pillars to form a shear crystal stack structure. Additionally, to reduce the clamping effect of bonding layer to the active crystal parts, the bonding area between the neighboring crystal parts are minimized and no whole piece of a metal shim is used. The epoxy bonding pillars may be optionally dispensed directly on crystal part surface or on an electrode applied to the crystal piece for improved conduction. The stack fabrication is optionally conducted with an automated system, where crystal piezoceramic part and tabs are picked and placed to desired locations on a platform for alignment following the preset operation steps. With the reduced clamping effect from bonding, such a piezoelectric d36 shear crystal stack exhibits substantial and surprisingly improved performance.

In one embodiment of the present invention, a piezoelectric stack arrangement is provided having reduced driving voltage while maintaining the same driving level and a managed clamping effect from the bonding of multiple layers by a proposed specially designed bonding layer structure.

in another alternative embodiment, the bonding layer consists of multiple discrete pillars/areas of a conductive adhesive epoxy, isolated small spacers and/or shim(s).

In another alternative embodiment, the size and arrangement of the discrete pillars are selected to minimize the clamping effect from the bonding as well as provide adequate bonding strength and overall stack structural strength.

In another alternative embodiment the arrangement of the discrete pillars may be modified for alternative effects on the final stack, including the use of discrete continuous strips of conductive epoxy, and differing discrete arrangements of conductive epoxy (cross-batch, parallel lines, square boxes, and differing discrete shapes (round; square, hexagonal, triangular, etc.).

In another alternative embodiment, the bonding adhesive epoxy pillars/areas can be constructed in alternative manners, including: being pre-formed then transferred to piezoelectric parts, directly printed or dispensed directly on the piezoelectric part surface or optionally dispensed directly on a conductive surface on the piezoelectric parts.

In another alternative embodiment, for a $d_{36}$ shear stack, crystal parts are specially selected and arranged so that motion of all crystal parts in a stack is synchronized and part displacement matched thereby providing substantial operational enhancement and reduction of the impact of clamping effect of the boned stack for transducer applications.

In another alternative embodiment, the proposed invention may be provided in a compacted transducer applications including in the use of medical and scientific imaging devices, sonar, and other high-sensitivity transducer applications.

According to another alternative embodiment of the present invention, a piezoelectric system is provided, comprising:

at least a first PMN-PT d36 structured crystal element, having a crystal composition represented by the formula;

$$x*ABO_3-y*PbTiO_3-(1-x-y)*Pb(Mg_{1/3}Nb_{2/3})O_3$$

wherein, x is defined as molar % 0 to 0.50;
y is defined as molar % 0 to 0.50;
A represents Lead (Pb) or Bismuth (Bi), and
B is represented by the one or more dopant elements selected from:

| Zr | Hf | Sn | In | Sc | Tm | Nb | Ta | Zn | Yb | Lu | Sb |
|---|---|---|---|---|---|---|---|---|---|---|---|
| Bi | Mn | Ga | Ce | Ni | W | Cu | Fe | K | Na | Li | Ba | the at least first crystal element having a cutting direction of one of a X-cut arrangement wherein the X-cut arrangement is a zxt+45° (±20°) cut arrangement and a Y-cut arrangement, wherein the Y-cut arrangement is a zxt-45° (±20%) cut arrangement; the at least first crystal, element prepared by poling along a <011> pseudo-cubic axis of the crystal element and having a poled-head side and a poled-tail side of the at least first crystal elements.

According to another alternative embodiment of the present invention there is a piezoelectric system, further comprising: a conductive electrode coating on a pair of Z surfaces of the at least first crystal element on the poled-head side and the poled-tail side; and at least one conductive lead on the first crystal element.

According to another alternative embodiment of the present invention there is a piezoelectric system, further comprising: at least a second the crystal element in a stack arrangement with the at least first crystal clement; the second crystal element being the other of the one of the X-cut and the Y-cut arrangement; at least a second respective conductive lead on the at least second crystal element; a plurality of discrete conductive adhesive pillars bonding respective opposing sides the crystal elements together and providing a conductive connection between opposed the conductive electrode coating; and the conductive lead bonded between respective first aryl second crystal elements.

According to another alternative embodiment of the present invention there is a piezoelectric system, wherein: a combined total surface area coverage of the discrete conductive adhesive pillars is less than 80% and less than 40% and less than 20% of a surface area of a respective the side of the crystal elements.

According to another alternative embodiment of the present invention there is a piezoelectric system, further comprising: a rigid conductive shim spacing first and second crystal elements in the stack; and the conductive shim conductively bonded to opposed conductive electrode coatings of the first and second crystal elements.

According to another alternative embodiment of the present invention there is a piezoelectric system, wherein: the stack arrangement further comprises at least four crystal elements; the crystal elements in the stack arrangement being selected in an alternating X-cut then Y-cut arrangement; each the crystal element in the stack arrangement having a respective conductive lead; and each the crystal element being bonded in the stack by the discrete conductive adhesive pillars.

According to another alternative embodiment of the present invention there is a piezoelectric system, wherein: the stack arrangement further comprises at least eight crystal elements; the crystal elements in the stack arrangement being selected in an alternating X-cut then Y-cut arrangement; each the crystal element in the stack arrangement having a respective conductive lead; and each the crystal element being bonded in the stack by the discrete conductive adhesive pillars.

According to another alternative embodiment of the present invention there is a piezoelectric system, wherein: each respective pair of the crystal elements in the stack arrangement being arranged in a poled-head side to poled-tail side orientation.

According to another alternative embodiment of the present invention there is a piezoelectric system, wherein: each respective pair of the crystal elements in the stack arrangement being arranged in an alternating poled-head side to poled-tail side pair orientation and poled-tail side to poled-head side pair orientation.

According to another alternative embodiment of the present invention there is a piezoelectric system, wherein: each respective pair of the crystal elements in the stack arrangement being arranged in a poled-head side to poled-tail side orientation.

According to another alternative embodiment of the present invention there is a piezoelectric system, further comprising: conductive connectors conductively joining respective the conductive leads of the respective at least first crystal element and the at least second crystal element; a driving circuit operative for driving the piezoelectric system; and the conductive connectors operatively connecting respective the crystal elements to the driving circuit.

According to another alternative embodiment of the present invention there is a piezoelectric system, further comprising: conductive connectors conductively joining respective the conductive leads of the respective at least alternating X-cut then Y-cut crystal elements; a driving circuit operative for driving the piezoelectric system; and the conductive connectors operatively connecting respective the crystal elements to the driving circuit.

According to another alternative embodiment of the present invention there is a transducer system, comprising: a head piece and a tail piece movable relative to each other; at least two opposed crystal element stack arrangements spacing the head piece from the tail piece in a first orientation; at least two opposed crystal element stack arrangement spacing the head piece from the tail piece in a second orientation; the first orientation and the second orientation being perpendicular to each other and operative to secure the tail piece to the head piece during a use of the transducer; and each the stack arrangement constructed as the stack arrangement in the piezoelectric system according to the present invention.

According to another alternative embodiment of the present invention there is a process for the preparation of a piezoelectric system, comprising the steps of mechanically at least a first PMN-PT d36 structured crystal element, having a crystal composition represented by the formula:

x*ABO3–y*PbTiO3–(1-x-y)*Pb(Mg1/3Nb2/3)O3 wherein, x is defined as molar % 0 to 0.50;
y is defined as molar % 0 to 0.50;
A represents Lead (Ph) or Bismuth (Bi), and
B is represented by the one or more dopant elements selected from:

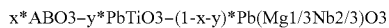

| Zr | Hf | Sn | In | Sc | Tm | Nb | Ta | Zn | Yb | Lu | Sb |
| Bi | Mn | Ga | Ce | Ni | W | Cu | Fe | K | Na | Li | Ba | cutting the at least first crystal element having in a cutting direction of one of a X-cut arrangement wherein the X-cut arrangement is a zxt+45° (±20°) cut arrangement and a Y-cut arrangement, wherein the Y-cut arrangement is a zxt-49) (±20°) cut arrangement; coating a conductive electrode coating on a pair of Z surfaces of the at least first crystal element; preparing the at least first crystal element by poling along a <011> pseudo-cubic axis of the crystal element under up to 1500V/mm and defining a poled-head side and a poled-tail side of the at least first crystal element; applying a plurality of discrete conductive adhesive pillars to less than a total surface are of the crystal element; and applying a conductive lead on the first crystal element; and further comprising the steps of: preparing at least a second crystal element as the first crystal element; selecting the second crystal element to be the other the cutting direction of the first crystal element creating an X-cut and Y-cut pattern; positioning the second crystal element on the first crystal element forming a stack arrangement therewith; the step of positioning including a step of orienting the second crystal element relative to the first crystal element in one of a poled-head side to poled-tail side or poled head-side to poled head-side according to a desired driving level of the stack arrangement; and joining the first crystal element to the second crystal element by bonding the crystal elements with the discrete conductive adhesive pillars; and further comprising the steps of: preparing at least a third and a fourth crystal element as the first crystal element; selecting the third and fourth crystal elements to be the other the cutting direction of the first crystal element and the second crystal element creating an X-cut to Y-cut pattern; positioning the first to fourth crystal elements together forming the stack arrangement therewith; the step of positioning including a step of orienting respective ones of the crystal element relative to adjacent crystal element in one of a poled-head side to poled-tail side or poled head-side to poled bead-side according to a desired driving level of the stack arrangement; and joining each respective the elements together by bonding the crystal elements with the discrete conductive adhesive pillars; and further comprising the steps of providing an assembly fixture operative to secure the stack arrangement during the step of joining; and positioning each respective the crystal element in the assembly prior to the step of joining, whereby each assembly fixture maintains an respective alignment of the crystal elements during, the step of joining.

The above and other aspects, features and advantages of the present invention will become apparent from the following description read in conjunction with the accompanying drawings, in which like reference numerals designate the same elements.

BRIEF DESCRIPTION OF THE DRAWINGS

FIG. 9 is an illustrative round transducer configuration using multiple stack configurations from a top or axial-view.

FIG. 10 is an illustrative wiring and arrangement diagram of an assembly of four A-stack arrangements relative to a central transducer tail piece as noted in FIG. 9; where the respective A-stack arrangements are pictographically illustrated relative to the central transducer tail piece for convenience and each respective A-stack is inverted as shown on opposite sides of the transducer tail piece for driving motion requirements.

FIG. 11 is an illustrative wiring and arrangement diagram of an assembly of four A-stack arrangements relative to a central transducer tail piece as noted in FIG. 9; where the respective B-stack arrangements are pictographically illustrated relative to the central transducer tail piece for convenience and each respective A-stack is inverted as shown on opposite sides of the transducer tail piece for driving motion requirements.

DETAILED DESCRIPTION OF THE PREFERRED EMBODIMENTS

Figure 1:
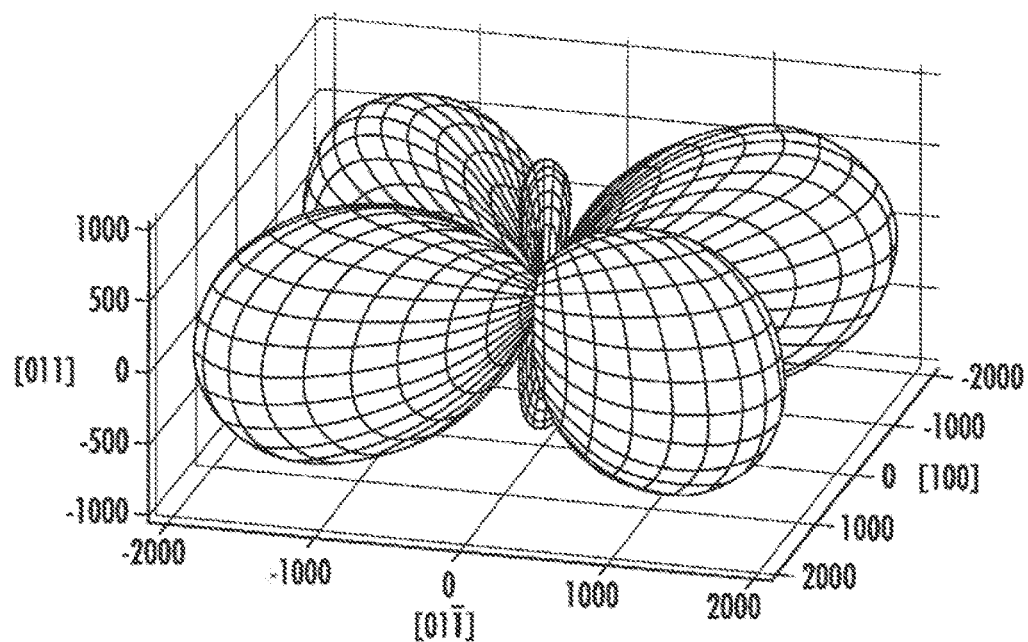
FIG. 1 shows 3D plot of the piezoelectric surface of $d_{36}$. Here, Z=<0,1,1>, X=<1, 0, 0> and Y=<0, 1, −1> and provide a pseudo-cubic notation.

Reference will now be made in detail to embodiments of the invention. Wherever possible, same or similar reference numerals are used in the drawings and the description to refer to the same or like parts or steps. The drawings are in simplified form and are not to precise scale. The words 'couple' or 'bond' or 'glue' or 'attach' and similar terms do not necessarily denote direct and immediate connections, but also include connections through intermediate elements or members or devices. For purposes of convenience and clarity only, directional (up/down, etc.) or motional (forward back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Piezoelectric crystal stack is developed to help reduce the driving voltage while maintaining the same driving level while avoiding the detriments of clamping effects. In a piezoelectric stack, the epoxy and/or shim in a bonding layer is a passive layer. As a result, bonding layer in a stack will clamp the motion of active piezoelectric parts. For shear stack applications however, (e.g., $d_{36}$ shear mode), the clamping effect from bonding layer can significantly degrade transducer performance. Thus it is critical to reduce the damping effect from the bonding so that the shear stack performance is maximized.

Figure 2:
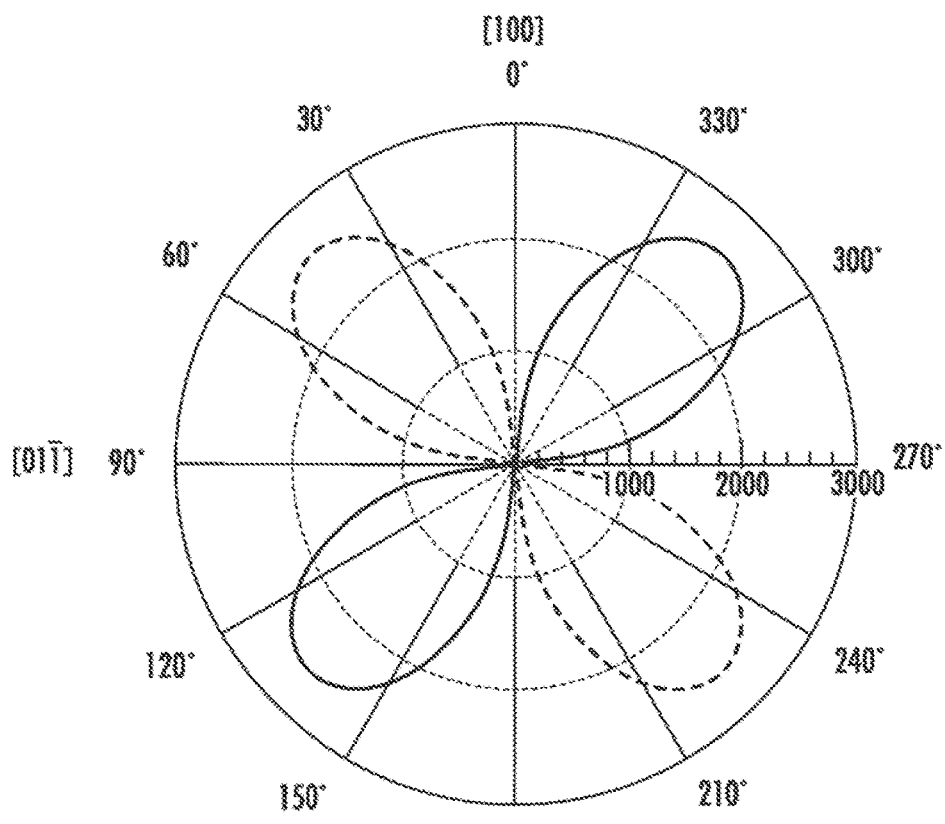
FIG. 2 shows A 2D plot, Z-cut cross section of the piezoelectric $d_{36}$ surface on the <011> plane. A maximum $d_{36}$ obtained as noted in U.S. Pat. No. 7,908,722 by the present applicant

Referring now to FIGS. 1 and 2, as is understood from Applicant's U.S. Pat. No. 7,908,722 (Han) issued Mar. 22, 2011, the entire contents of which are incorporated herein by reference for understanding, a piezoceramic element in $d_{36}$ shear mode poled along <011> may be obtained with beneficial properties.

In view of the above, and as noted in Applicant's U.S. Pat. No. 7,908,722 (Han) it will be understood here that there are two descriptive types of $d_{36}$ samples for the zxt±45° (±20°) cuts or zt±45° (±28°) (cuts provided depending upon the description used thus the references to 'zxt' and alternatively described as 'zt' are understood to be referring to the same descriptive meaning rotation ±45° of the $d_{36}$ piezoceramic element); and that these correspond and are designated herein as an "X-cut" (zxt±45°(±20°)) and "Y-cut" (zxt-45° (±20°)) nomenclature, or alternatively "X-cut-processed" and "Y-cut-processed" or more simply "X-type" or "Y-type" or a similar related nomenclatures. As a result, when used in the claims herein "X-cut" and "Y-cut" will be terms understood by those of skill in the art relative to $d_{36}$ single crystal elements.

As will also be understood, for x-cut and y-cut piezoelectrodes. When the driving field is the same as the poling direction; one type shears in the counterclockwise direction and the other shears in the clockwise direction, so that the X-cut and Y-cut will be understood to shear in opposite directions. Either x-type or y-type may be used separately or combined but when used or combined inappropriately are ineffective and troublesome in transducer arrangements. As a result, the present invention provides improved reduced driving voltage while maintaining a driving level by selecting specific X-cut and Y-cast arrangements.

In U.S. Pat. No. 7,908,722 a method was provided for generally preparation of the single crystal elements, now modified to include the steps of: (a) mechanically finishing of a single crystal element with cuttings (X-cut or Y-cut) such as here zxt±45° (±20°); (b) coating electrodes on a pair of Z surfaces; and (c) poling the single crystal in the direction along the <011> cubic axis at up to 1500V/mm or more electrical field at room temperature. As there are X-cut and Y-cut $d_{36}$ shear mode crystals each can be prepared in a similar manner, as will be understood by those of skill in the art now having understood the present invention. It will also be understood that the respective X-cut/Y-cut ±45° cuttings may be at ±5°, or ±10° or ±15° or ±20° (as noted above) without departing from the scope and spirit of the present invention.

As will also be understood a single crystal element poled in the direction along <011> creates what will be nomenclature defined here as a "poled-head-side" 20 in the poling direction one face of the single crystal element and a "poled-tail-side" 21 on the opposite face of the single crystal element (see FIGS. 7 and 8); such that a 'poled head' is on the opposite face as the 'poled-tail' established by the poling direction for a crystal element.

The design and fabrication technique of the piezoelectric stack apply to the PMN-PT based single crystals, having the crystal composition represented by the formulas:

x*ABO$_3$-y*PbTiO$_3$-(1-x-y)*Ph(Mp$_{1/3}$Nb$_{2/3}$) O$_3$

Where, x is defined as 0 to 0.50; and y is defined as 0 to 0.50

A represents Lead (Pb) or Bismuth (Bi),

B is represented by the one or more dopant elements. The dopant element(s) can be single element or combination of one or more of the elements listed in Table 1.

TABLE 1

| Dopant (used alone or in combination) | | | | | | | | | | |
|---|---|---|---|---|---|---|---|---|---|---|
| Zr | Hf | Sn | In | Sc | Tm | Nb | Ta | Zn | Yb | Lu | Sb |
| Bi | Mn | Ga | Ce | Ni | W | Cu | Fe | K | Na | Li | Ba |

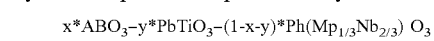

All crystals above can be doped with any dopant up to 20% (wt %). For example, a dopant may be with Manganese (Mn) up to 20% (wt%) or Cerium (Ce) up to 20% (wt%). Any combination of dopants may be used and such dopants are not limited.

Figure 3:
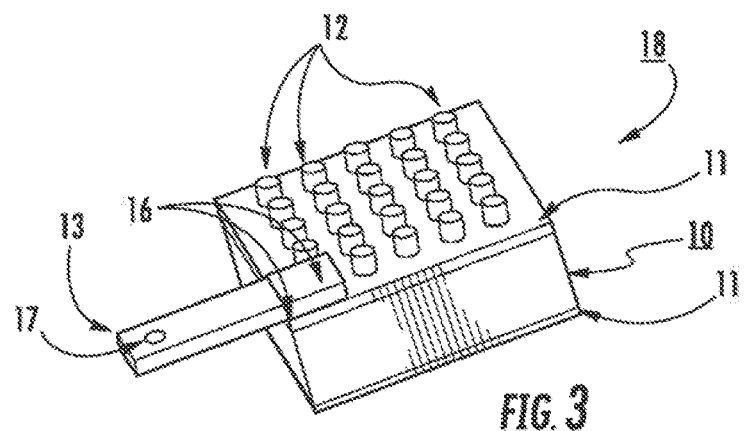
FIG. 3 is a pictographic representation of a single crystal element according to the present invention.

Referring now to FIG. 3 a single piezocrystal element 10 has an optional conductive electrode coating 11 on either face thereof. Element 10 has already been poled and prepared as discussed herein. On one side of coating 11 are provided a plurality bonding conductive adhesive epoxy pillars 12. In an alternative, discussed below, an entire side of coating 11 could be covered with a conductive adhesive epoxy. A conductive metallic lead 13 is bonded to coating 11 of element 10 with a conductive adhesive layer 16. Lead 13 may be of any conductive material, metallic including silver, gold, copper, bronze, aluminum, or any alloy of any suitable material or ceramic, and in one preferred embodiment is of brass providing a balance of working strength and conductivity. Conductive adhesive layer 16 may be the same conductive epoxy used for pillars 12 or any other type of conductive adhesive without departing from the scope and spirit of the present invention. As a result, it will be understood that the pillars 12 and adhesive layer 16 may be the same or different compositions. A connector hole 17 is provided in lead 13 for convenient securing of later thin connectors. In effect the assembly of element 10, with optional coating 11 and pillars 12 with a lead 13 provides an assembled crystal stack clement 18 as noted.

The method for applying conductive pillars 12 or optionally a full conductive surface coating, may include optionally stencil printing, use of pre-formed conductive bonding layer, or other adaptive methods, provided that the method used is effective for uniformity and high reliability and consistency. Upon application of the pillars 12 or other coating and positioning of the lead 13 with respective conductive layers 16, a stack assembly I is constructed and pressed to ensure reliable bonding between all the elements. It will be understood that pillars 12 or other conductive bonding arrangement may be descriptively discussed as a bonding layer, within the scope and spirit of the present invention.

Provided that the stack elements 18 are bonded effectively into a cohesive stack and electrical conduction is maintained a variety of conductive adhesives, resins, binders, inks, glues, etc. may be employed without departing from the present invention. A non-limited listing of optional conductive adhesive providers for products includes: Creative Materials, Inc., Tyngsboro, Mass. (www.creativematerials.com), Resin Designs. LLC, Woburn, Mass. (www.resindesigns.com), Extreme Adhesives, Inc., Raymon, N.H. (www.extremeadhesives.com), and Henkel, Inc. (www.henkel.com). The conductive adhesive bonding material may be any suitable material, but must have an operational temperature that is less than the depoling temperature of the crystal.

Figure 4:
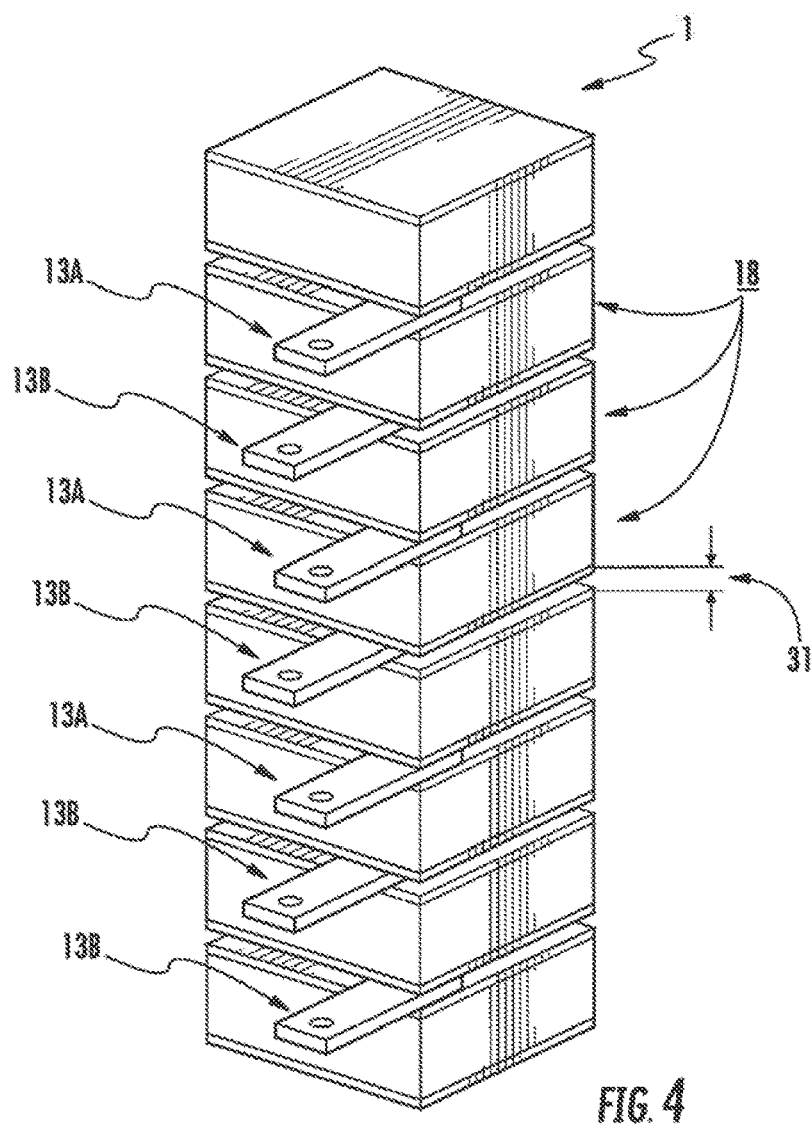
FIG. 4 is a representation of an eight-stack arrangement of single crystal elements according to the present invention.

In FIG. 4 a stack assembly 1 of stack elements 18 is provided for descriptive purposes. Each stack element 18 is provided with a lead 13, and for purposes herein of driving the stack assembly 1, selected leads 13 are designated as positive (+) leads 13A and negative (−) leads 13B for later connection with respective connectors (wire lines or thin conductors) 15 and there through to a driving circuit 30 for later driving control of the stack assembly 1. A gap or spacing 31 is provided between respective elements 1 depending upon the thicknesses of the related components. As discussed herein, for a stack assembly 1, a minimum of two (2) stack elements 18 is needed, and arrangements of four (4), eight. (8), ten (10) and optionally up to one hundred (100) or more stack elements 18 may be used without departing from the scope and spirit of the present invention. The discussions herein provide for a stack of eight (8) elements 18 for practical purposes of a convenient size for construction; such that each crystal element 10 may have an exemplary thickness of 0.8mm (800 microns) and an exemplary gap 31 of approximately 4 mills, the result of pillars 12 being of a 6-8 mills on application and then pressed to approximately 4 mills for bonding during stack construction. However, for other small sized transducers, micro electro mechanical systems (MEMS), and nano electro mechanical systems (NEMS), within the scope of the present discussion, very small components, gaps, and other dimensions may be used and still remain within the scope of the present invention.

Figure 5:
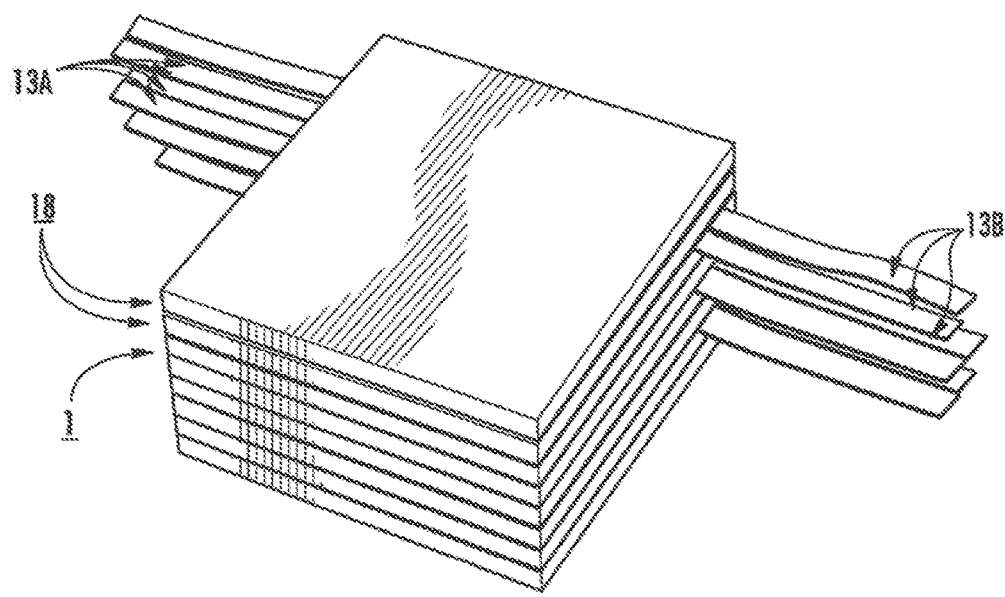
FIG. 5 is a perspective image of a physical eight-stack arrangement with +lead and −leads on different sides of the stack.
Figure 6:
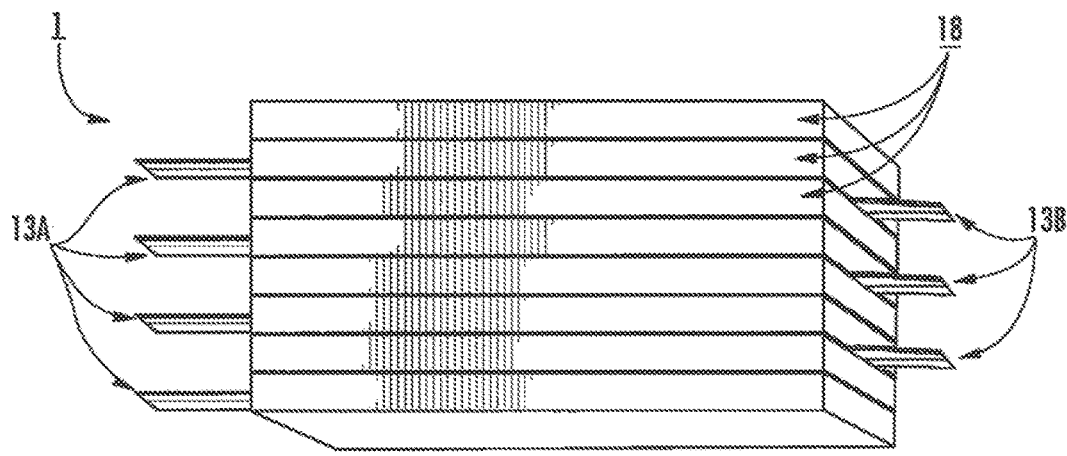
FIG. 6 is an end elevation image of the eight-stack arrangement of FIG. 5 noting the +lead and −lead on different sides of the stack in the alternative arrangement discussed herein.

Referring to FIGS. 5 and 6 a pictographic representation of an eight element stack 1, with respective leads 13 provided as positive leads 13A and negative leads 13B projecting from opposite sides of the stack for convenience in later construction and assembly with a transducer or other device.

Figure 7:
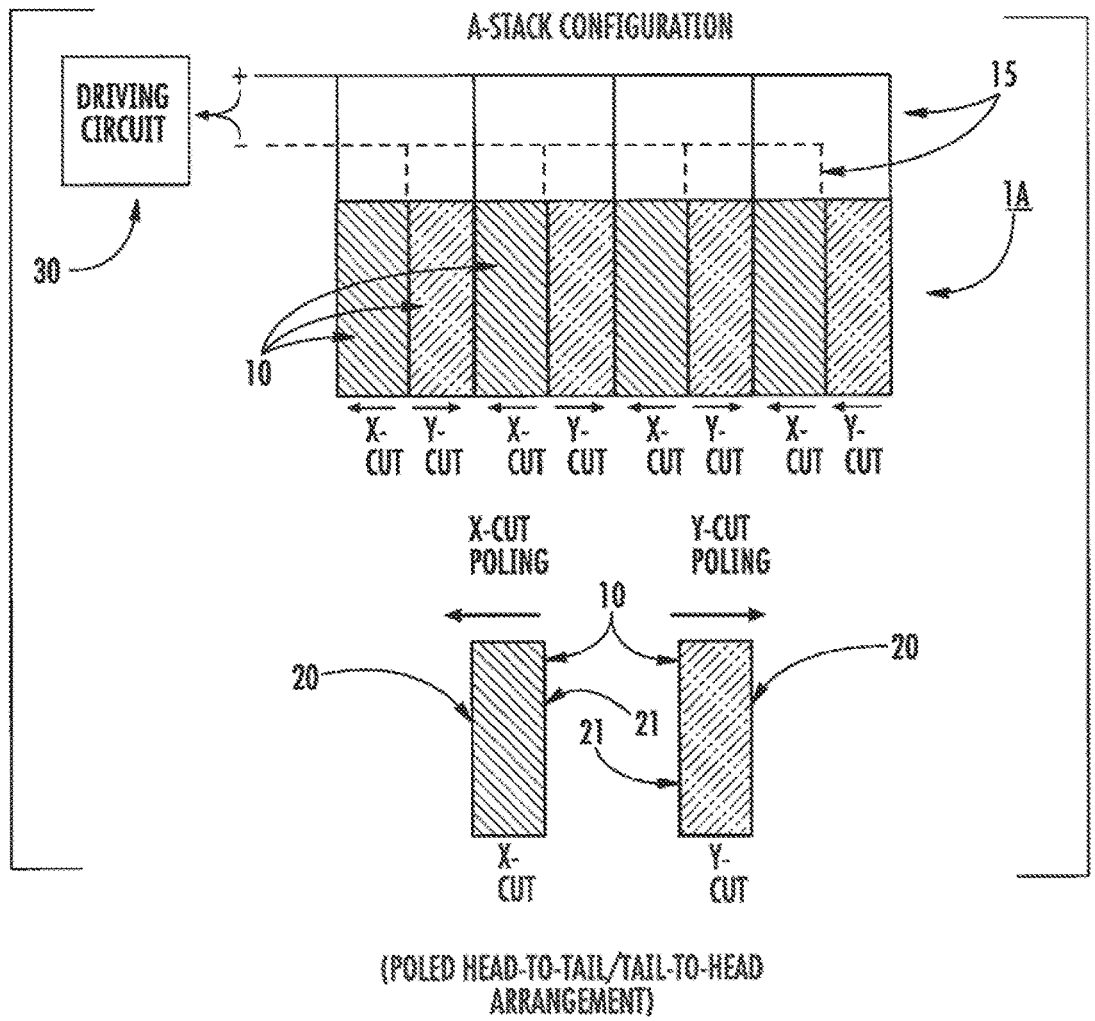
FIG. 7 is a combined stack and wiring configuration illustration, termed A-stack, wherein the arrangement is provided with a poled-head-to-poled-tail/poled-tail-to-poled-head for respective X-cut and Y-cut elements, as depicted therein for the stack arrangement operatively linked to a driving circuit.

Referring now to FIG. 7 an illustrative arrangement of a stack assembly of respective stack elements 18, here termed an A-stack or a stack 1A is provided arranged relative to respective poled head sides 20 and poled tail sides 21 in a poled-bead-to-poled-tail to poled-tail-to-poled-bead arrangement for X-cut and Y-cut crystal elements 10.

Referring now to FIG. 7 an illustrative arrangement of a stack assembly of respective stack elements 18, here termed an A-stack or a stack 1A is provided arranged relative to respective poled head sides 20 and poled tail sides 21 in a poled-head-to-poled-tail to poled-tail-to-poled-head arrangement for alternating X-cut and Y-cut crystal elements 10. As noted therein, respective positive and negative leads 13A/13B are respectively connected by electrical connectors 15 to an illustrative driving circuit 30, for use in a transducer or other piezoelectric device.

Figure 8:
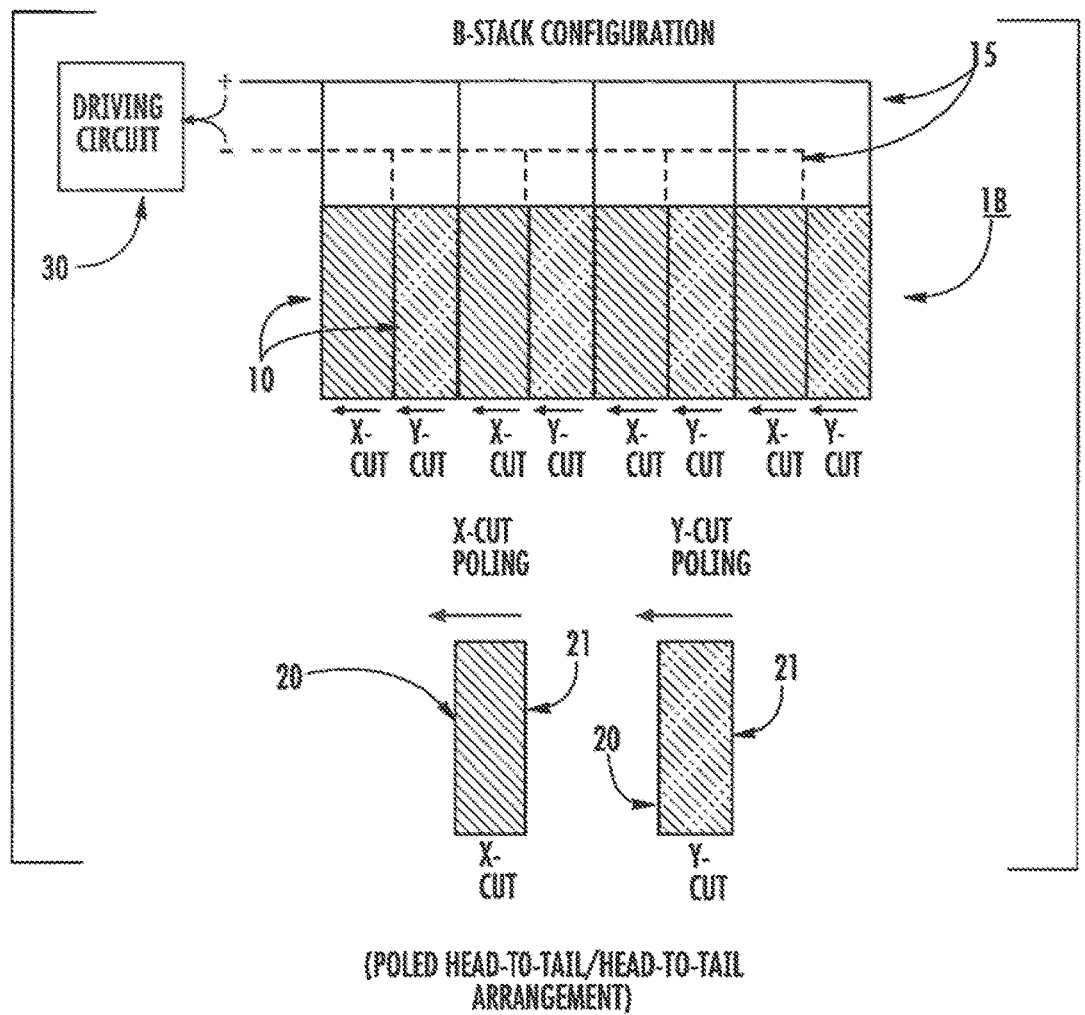
FIG. 8 is a combined stack and wiring configuration illustration, termed B-stack, wherein the arrangement is provided with a poled-head-to-poled-tail/poled-head-to-poled-tail for respective X-cut and Y-cut elements, as depicted therein for the stack arrangement operatively linked to a driving circuit.

Referring now to FIG. 8 an illustrative arrangement of a stack assembly of respective stack elements 18, here termed a B-stack or a stack 1B is provided arranged relative to respective poled head sides 20 and poled tail sides 21 in a poled-head-to-poled-tail to poled-head-to-poled-tail arrangement for alternating X-cut and Y-cut crystal elements 10. As noted therein, respective positive and negative leads 13A/13B are respectively connected by electrical connectors 15 to an illustrative driving circuit 30, for use in a transducer or other piezoelectric device.

Table 1 provides a brief summary of A-stack and B-stack arrangements noted FIGS. 7 and 8 generally, or with comments.

TABLE 1

| $d_{36}$ Configuration | A-Type Stack Arrangement | B-Type Stack Arrangement |
|---|---|---|
| Driving voltage (V) | High V is possible. High driving voltage is needed for high power transducer | Limited by coercive field of the crystal |
| Bias field | Bias field is possible if needed. Bias field allows a high drive voltage | Cannot apply bias |
| $d_{33}$ comments | $d_{33}$ effect of crystal plates adds up and can be harmful for certain applications, especially for stacks of many layers | $d_{33}$ effect of crtystal plates cancels out. This is good for applications where thickness-mode vibration is harmful. Useful if minimal $d_{33}$ stack is needed |
| Number of components | Minimum 2 Maximum 100 | Minimum 2 Maximum 100 |
| As shown stack of eight components | Limited only by the practical ability to cut the crystal element. Here, in FIGS. 5-6, for practicablility is about 800-850 microns (0.80 mm-0.85 mm) | |

It is additionally noted herein, but not depicted, that alternative stack arrangements I may be constructed only from X-cut elements or only from Y-cut elements within the scope of this invention. And such stacks would be secured with the associated discrete adhesive pillars 12 and related leads 13 and connectors 15. However, it is noted that such only-X-cut stacks and only-Y-cut sacks suffer from electro-operative detriments that make them troublesome if used, and which are overcome by the preferred embodiments noted herein.

It is further noted, but not depicted an alternative stack arrangement 1 may he constructed from alternating groups of X-cut and groups of Y-cut elements within the scope of this invention. For example, a stack arrangement of X-cut/X-cut/Y-cut/Ycut could be contemplated. Similarly, such stacks would be secured with the associated discrete adhesive pillars 12 and related leads 13 and connectors 15. However, it is noted that such grouped-X-cut and grouped Y-cut sacks suffer from electro-operative detriments that make them troublesome if used, and which are overcome by the preferred embodiments noted herein.

Referring now to FIGS. 9-11 an illustrative and non-limiting exemplary embodiment of a round transducer assembly 40 is provided having a transducer head piece 41 and a transducer tail piece 42 and a series of opposed stack arrangements 1 (shown as a group of four, but not limited thereto). The stack arrangements in this exemplary embodiment are shown with four stacks 1, but a group of 8 stacks or any other stack-groupings may be used tailored to a particular operational driving need. Each stack arrangement 1 provided with a shim or a bonding or a hearing layer 43 for fixing each respective stack between to head piece and tail piece of the transducer. In this embodiment bearing layer 43 is constructed from alumina ($Al_2O_3$), but other bearing materials and arrangements may be used without departing from the scope and spirit of the present invention. As depicted in FIGS. 10 and 11, alternative stack arrangements 1A, 1B are provided according to the described 1A stack sequence and 1B stack sequence.

Figure 12:
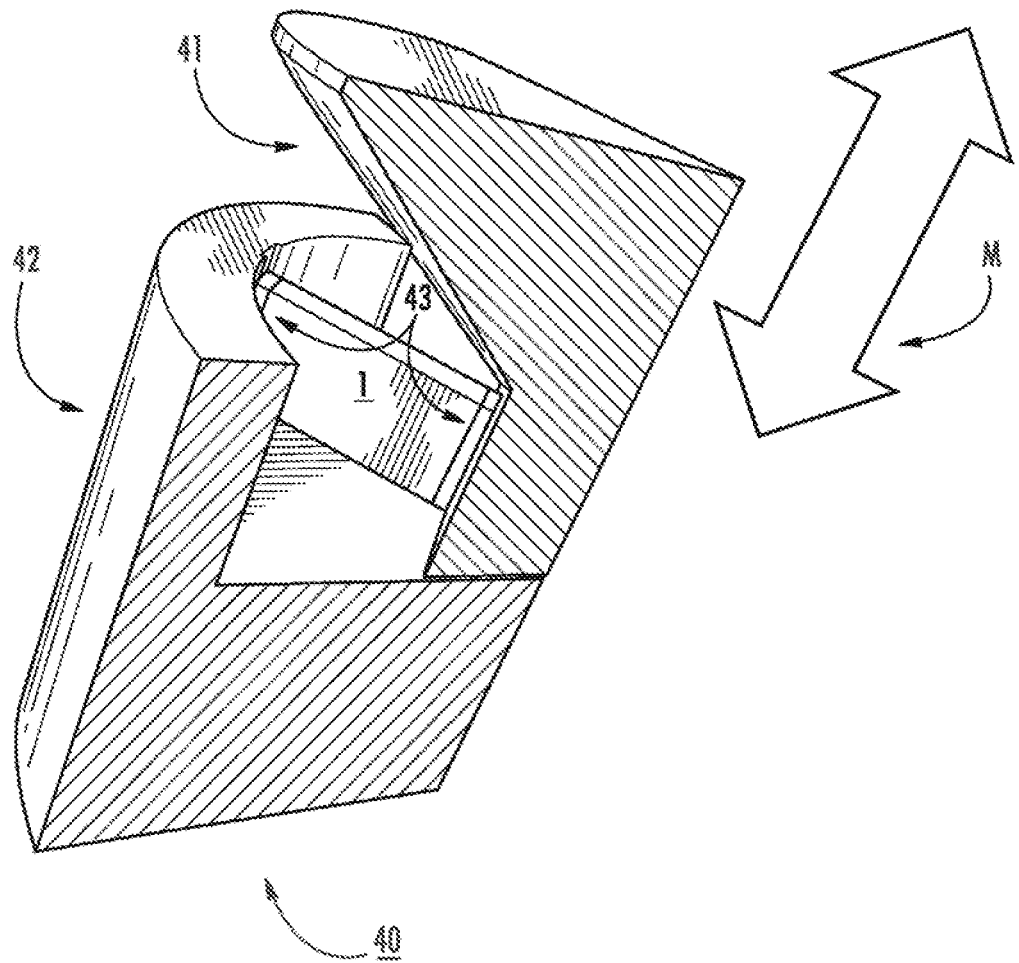
FIG. 12 is an illustrative shear mode projector depicted as a one-quarter shear transducer 9 the illustration being a one-quarter of a full-round transducer sectioned to illustrate the position of the stack assembly relative to the plane of shear motion, providing a useful packaging in a lower profile, and optionally low frequency transducer.

Referring now to FIG. 12, an exemplary illustration of a one-quarter portion of a shear mode transducer 40 similar to the type noted in FIG. 9 is provided noting a stack arrangement 1 depicted positioned relative to the respective head piece 41 and tail piece 42 for shear motion. As noted herein, the polarization is perpendicular to the plane of the shear mode. This packaging is useful in lower profile and low frequency transducers.

Overall, the present invention depicts operative crystal elements 10 forming stack elements 18 arranged into a stack arrangement 1 using the formula noted below for a piezoelectric crystal component having the formula noted below. Baring testing of such components, the following Table II of related properties was determined.

TABLE II

| $\varepsilon_{33}^T/\varepsilon_0$ | $d_{36}$ | $k_{36}$ | $s_{66}^E$ |
|---|---|---|---|
| 2,000-7,000 | >500 pC/N | >0.70 | $>80 \times 10^{-12}$ m²/N |

As can be appreciated, while the driving voltage is high for a monolithic component design (e.g., about 4 kV/cm at 2000 volts/5 mm monolithic and about 1000 volts/2.5 mm monolithic) and step-up transformers are bulky the benefit of a compact d36 tranducer design is not possible. A piezoelectric shear stack assembly 1 with $d_{36}$ shear coefficient may be very high (>500 pC/N as shown) and including at least 3500 pC/N or more than 5000 pc/N or more at room temperature.

However, with the proposed thinner d36 crystal stack (or plate) construction there is a reduction in driving voltage while maintain the same driving level (same E field). As a result, applicant invented the current crystal plate reinforced stack structure.

To minimize the clamping effect of the bonding layer while provide reasonable bonding and structural strength., the invention provides the stacked bonding layers as discussed herein. As shown, the discrete pillars between the crystal parts are specially designed and arranged to provide the bonding strength between piezoelectric parts and structural reinforcement to the whole stack, as well as the electrical connection between neighboring piezoelectric parts. Optionally, to further control the thickness of the bonding layer, small isolated metal spacers (not shown) of possibly between 2-20% of the contact surface area, can be used to gauge the bonding layer thickness when stack is compressed. Such metal shims (not a whole piece metal shim like in a typical $d_{33}$ piezoelectric stack) to still further minimize the clamping effect in a shear piezoelectric stack. Again, configuration arrangements and assembly fixtures for automated processing are provided herein.

In Table 3 below, electrical property measurements of crystal parts and stack and bonding arrangements are provided. As shown, Stack 1 has discrete conductive epoxy pillars with reduced surface contact area and Stack 2 has a continuous layer of the same conductive epoxy used in Stack 1. As a result. Table 3 compares the damping effect of stack with the discrete epoxy pillars and the continuous layer of epoxy. The stack with discrete epoxy pillars shows ~20% (reduction from 2731 to 2172) decrease in overall K compared to the average K values of the crystal parts prior to bonding. The stack with continuous epoxy has over 30% decrease in the stack K value. The discrete epoxy pillars are therefore shown to help to reduce the clamping effect of the bonding. The result is on small signal measurement. The stack is expected to have higher clamping effect when stack is driven at normal working conditions. The stack is sorted by K values in Table 3 and is not presented in a stack-sequence-type format (e.g., front-to-tail/tail-to-front etc.). The sequence of the stacks 1 and 2 in the Table 3 were in the eight-element A-type stack arrangements (FIG. 7 type) when tested, and then the data assembled by K-value.

TABLE 3

| Sample ID | C (pF) | K | tgδ | $d_{36}$ | K ratio |
|---|---|---|---|---|---|
| S1-p1 | 6261 | 3407 | 0.0013 | Y-cut | |
| S1-p2 | 6281 | 3414 | 0.0011 | X-cut | |
| S1-p3 | 6290 | 3420 | 0.0012 | Y-cut | |
| S1-p4 | 6300 | 3426 | 0.0012 | Y-cut | |
| S1-p5 | 6314 | 3435 | 0.0012 | X-cut | |
| S1-p6 | 6351 | 3454 | 0.0014 | X-cut | |
| S1-p7 | 6373 | 3474 | 0.0013 | Y-cut | |
| S1-p8 | 6390 | 3480 | 0.0012 | X-cut | |
| Stack 1 | 40138 | 2731 | 0.0018 | | 0.795 |
| S2-p1 | 5721 | 3108 | 0.0011 | Y-cut | |
| S2-p2 | 5835 | 3170 | 0.0013 | Y-cut | |
| S2-p3 | 5879 | 3196 | 0.0014 | X-cut | |
| S2-p4 | 5890 | 3204 | 0.0009 | Y-cut | |
| S2-p5 | 5937 | 3226 | 0.0012 | Y-cut | |
| S2-p6 | 6001 | 3264 | 0.0007 | X-cut | |
| S2-p7 | 6069 | 3296 | 0.0012 | X-cut | |
| S2-p8 | 6081 | 3308 | 0.0012 | X-cut | |
| Stack 2 | 30229 | 2172 | 0.003 | | 0.674 |

Note:
K ratio calculated as the $K_{stack}/K_{ave}$

Depicted here: Stack 1: Bond with epoxy pillars (<20% electrode coverage) and Stack 2: Bond with full epoxy pad (100% electrode coverage)

The pillars 12 diameter or small dimension can optionally be as small as 0.05 mm, or as large as 50% of the part width/length and may be in any shape (round, square, triangular, etc. as discussed herein and below). Pillar height can optionally be any suitable height, but options include 0.100 mm (100 microns), 0.05 mm (50 microns) up to 50% of the piezoelectric part thickness. The range of the pillar height can be varied to suit the need of the stack arrangement 1.

To minimize the stress from poling, shear stack uses poled piezoelectric parts to build stack. The temperature for the whole process of stack fabrication has to be controlled not to exceed the depoling temperature of the piezoelectric crystal.

The discrete conductive epoxy pillars/areas between piezoelectric parts can be formed/fabricated in several different ways, including preformed pillars that are later transferred to crystal parts, screen printer pillars (of any desired configuration) may be provided directly on crystal part surface, or directly dispensed conductive epoxy on crystal part surface, without departing from the scope and spirit of the present invention.

Figure 13:
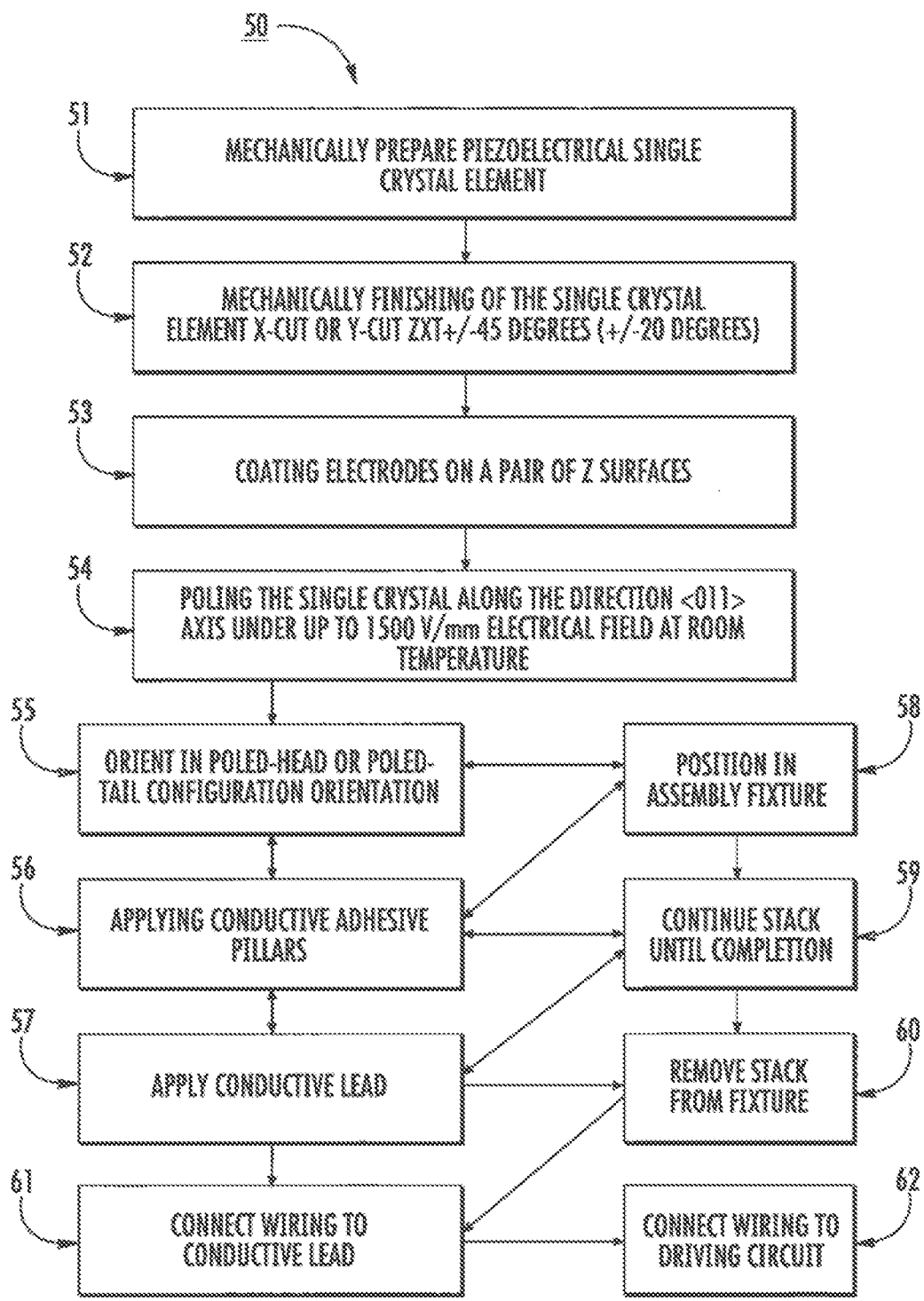
FIG. 13 is a flow chart of a method of preparing a piezoelectric stack according to one aspect of the present invention.

Referring now to FIG. 13, is a flow chart of a method 50 of preparing a piezoelectric stack according to one aspect of the present invention. It is to be understood that the steps in method 50 may be modified and in some cases be made optional within the scope and sprit of the present invention.

In method 50, a first step 51 provides for mechanically preparing a single crystal element 10 as discussed herein. In a step 52, a step is provided of mechanically finishing the single crystal element 10 in an x.-out y-cut arrangement as discussed herein for assisting in stack preparation. Step 53 provides for the optional conductive electrode coating of on a pair of Z surfaces for each element. Step 54 provides for poling the element along the <011> axis under a V/mm electrical field at room temperature or at any other appropriate field and temperature appropriate to the proposed need fur a stack arrangement.

In Step 55, there is a step of orientation in a poled-head side or poled-tail side position according to the desired stack arrangement as discussed herein. In a step 56 (or optionally into an assembly jig in a step 58) the element is positioned and conductive adhesive pillars are applied (and optionally any conductive shims installed); and in a step 57 a conductive lead may be installed. Either step 56 or 57 may be conducted first without restriction according to a user's desire. Thereafter, in a step 58 the prepared and pillar-ed element is positioned, and these steps repeated in a logic step 59 until an entire stack is assembled and ready for removing from the fixture 60 or otherwise ready for further processing. In a step 61 wiring is connected to the conductive leads and thereafter to a driving circuit 61. Additionally, assembly with multiple stacks or with other transducer or other system components may additionally occur within the scope of the present invention.

Figure 14:
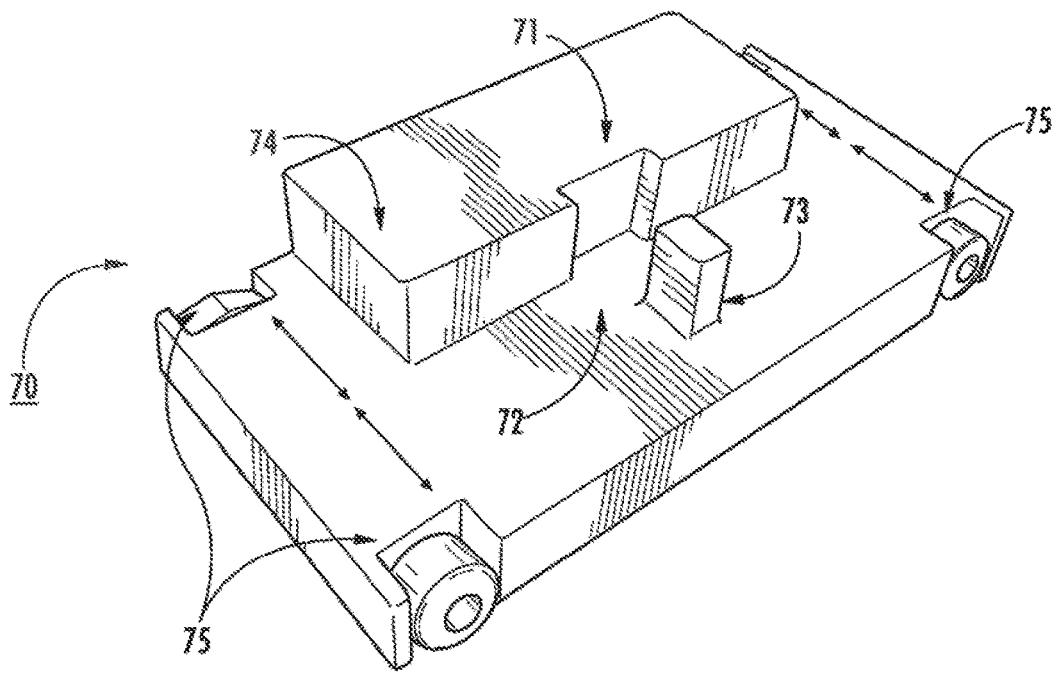
FIGS. 14, 15, and 16, are illustrative arrangements of assembly fixtures for use in assembling a piezoelectric stack according to alternative aspects of the present invention.
Figure 15:
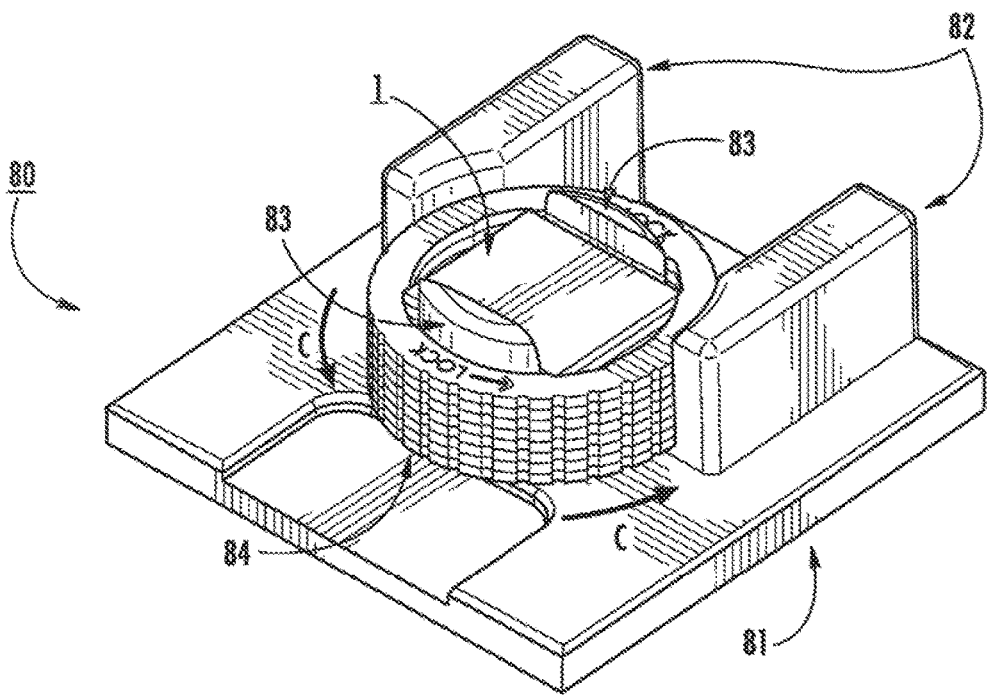
Figure 16:
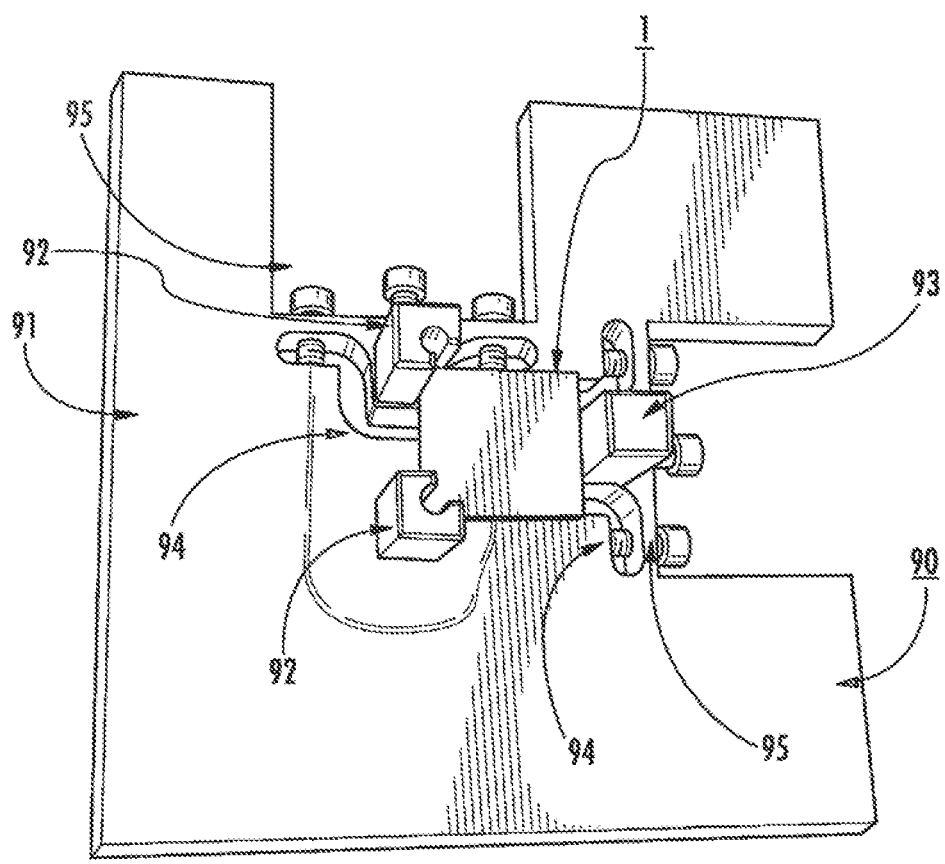

Referring now to FIGS. 14-16, a number of alternative assembly fixtures 70, 80, and 90 are discussed to assist in the precision assembly of a stack arrangement 1 of stack elements 18 according to the present invention. In FIG. 14 an assembly fixture 70 is provided with two opposed movable block sides, movable relative to each other for a clamping a stack (not shown) in a stack building location, 71 where a projecting leg 73 is urgable relative, to a back block 74 shaped to receive the stack-edges (shown). Opposed clamping screws75 on either side of assembly fixture 70 drive each opposed block side toward and away from each other and therefore, the carried projecting leg 73 and building location 71. As building leg 73 is perpendicular to the fixture surface, and back block 74 also projects perpendicular to the fixture surface, a stack (not shown) is maintained in a closely aligned and uniform assembly. It will be understood that assembly fixture 70 can be used in an integrated manner with an automated (robotic) assembly process, where an automated grip-motion arm places prepared stack elements 18 in the precise location in a repeated-step-manner and fixture maintains alignment while the stack is being built and assembled. Then, the assembled-not-yet-cured stack can be pressed to ensure contact of the pillars and the stack held in a stable aligned manner until the pillars are cured.

In FIG. 15, an alternative assembly fixture 80 is provided with an assembly platform 81 providing a planar foundation and projecting stabilizers 82, 82 there between. Projecting from platform 81, and movable relative to each other are projecting alignment and clamping fingers 83, 83 which move along pathways within clamping platform 81 relative to a stack arrangement 1. Clamping fingers 83 have flat and parallel sides so as to maintain a stack-alignment during a stack building and assembly process. A locking ring 84 rotationally movable in a clamping-unclamping rotation C which in turn secures relative alignment and clamping fingers 83, 83 about stack arrangement 1. As a result, it will he understood that assembly fixture 80 can be used in an integrated manner with an automated (robotic) assembly process, where an automated grip-motion arm places prepared stack elements 18 in the precise location in a repeated-step-manner and fixture maintains alignment while the stack arrangement 1 is being built and assembled on fixture 80. Then, the assembled-not-yet-cured stack can be pressed to ensure contact of the pillars and the stack held in a stable aligned manner until the pillars are cured.

in FIG. 16, an alternative assembly fixture 90 is provided with an assembly platform 91 providing a planar foundation and projecting stabilizers 92, 92 thereon. Projecting from platform 91, and movable relative to each stabilizer is a projecting alignment and clamping leg 93 which moves along pathways within clamping platform 91 relative to a stack arrangement 1. Clamping leg 93 and stabilizers 92, 92 have flat and parallel sides so as to maintain a stack-alignment during a stack building and assembly process. A number of positioning slots 94 on platform91 allow positioning of clamping leg 93 relative to stabilizers 92, 92 to accommodate different sized single crystal elements. Stabilizers 92 each have an open end 92A for accommodating the corner of an element without damage. A single initial element 18 is shown for building a stack arrangement I during, a use. A series of clamping screws 95 are positioned in relative X-Y positions so as to receive and lock damping leg 93 relative to platform 91. As a result, it will be understood that assembly fixture 90 can be used in an integrated manner with an automated (robotic) assembly process, where an automated grip-motion arm places prepared stack elements 18 in the precise location in a repeated-step mariner and fixture maintains alignment while the stack arrangement 1 is being built and assembled on fixture 90. Then, the assembled-not-yet-cured stack can be pressed to ensure contact of the pillars and the stack held in a stable aligned manner until the pillars are cured.

An automated (robotic) system (not shown, but discussed herein) has been design to improve the stack building quality and efficiency, and suitable assembly fixtures 70, 80, 90 are provided for enabling secure orientation between stack elements until the discrete adhesive pillars 12 are dry and secure each stack element together in a highly accurate arrangement. It will be understood that a desired robotic system will operably include all required control, memory, computer processing controls (CPUs) and processing computer elements and input systems necessary to functionally operate an assembly robot to create the proposed invention and method for the same.

Dispensing the epoxy directly on part right before stacking provides fresh wet adhesive surface, which leads to a stronger bonding and more robust process when a new crystal is rapidly positioned if the next and subsequent stack element can be positioned for bonding before the adhesive surface begins to dry. Generally, crystal elements 10 are first selected based on their dielectric and piezoelectric properties (including X-cut or Y-cut). These parts are placed on storage location (tray) according to the order to which they will be assembled in a stack. (It will be understood that data unique to each crystal part may be entered in a computer so that a 'best-stack-build' may be arranged selecting desired crystal parts individually based on their specific qualities).

A crystal part is first pick and placed before dispensing epoxy pillars on the surface. Spacers and tab are subsequently picked and placed from different locations of the tray to desired locations. This process repeats until the required layers of the stack is reached. The manual and automated assembly sequence for a stack is similar except that the handling and alignment of parts initially is manual.

As discussed herein the piezocrystal parts can be as large as 3"-6" in length/width and from as low as possibly 0.20 mm (200 microns) to as thick as 10 mm (10,000 microns) in thickness. As a result, there is no limitation on the dimensional size of the current stack construction, but rather these features allow a user to optimize the electrical performance to the needed device.

Various operations may be described as multiple discrete operations in turn, in a manner that may be helpful in understanding embodiments of the present invention; however, the order of description should not be construed to imply that these operations are order dependent.

It will also be understood, that as used herein the phrases 'selecting' or 'depositing' or 'applying' are understood as the application of various steps, such that other phrases may be used to achieve similar results without departing from the scope and spirit of the present invention.

It will also be understood that the phrase 'adhesive' or 'epoxy' as in 'conductive epoxy' or 'adhesive epoxy' or 'ink' as in 'conductive ink' will be non-limiting to the need for a conductive medium, including conductive inks, that will secure in an adhesive-like-manner the specific crystal elements and lead components as used herein in a comprehensive stack assembly. As such, compositions that act in an 'adhesive-like-manner' but are not epoxies, including inks, paints, resins (single component or multi-component), thin films, spray coatings, glues, caulks, or other 'layers' may be used without departing from the scope and spirit of the present invention and understood as being equivalents for the adhesive coating or adhesive deposits or adhesive layers as depicted herein.

Additionally, the phrase 'discrete' in discrete conductive pillars is used descriptively to represent that each pillar, of any shape arrangement, is separate from any adjacent pillar. Therefore, it will be understood that each pillar being formed in any cross-sectional shape (round, square, rhombohedral, ovoidal, triangular, hexagonal, polygonal, arcuate-curved shape, extended line-shape, etc.) is separate from an adjacent pillar and such adhesive conductive pillars would not be understood to be continuously joined in a preferred mode, but may be linked in an optional mode or web-like arrangement. As a result, a total surface area of coverage for such adhesive conductive epoxy is greatly reduced while the connective strength of each stack is maintained. Additionally, by the use of conductive pillar adhesives, including conductive epoxies, a conductive electrode coating on piezoelement surface may be used alternatively or possibly eliminated alternatively. Such that use of a conductive electrode is now optional.

It will be understood that various descriptive phrases are recognized and understood in the art within the scope and spirit of the present invention and may be used descriptively. For example piezoelectric single crystal materials may also be termed piezoceramic materials, or piezocrystals or solid-solutions, or more specific PMN-PT-based materials may be identified with further specificity such as PMN-PT, PIN-PMN-PT and Mn:PEN-PMN-PT and other arrangements and compositions effective to function as piezoelectric components within the scope of the present invention. Such materials may be used in transducers, micro electro mechanical systems (MEMS) and nano electro mechanical system (NEMS) within the scope of the present discussion.

Similarly, it will be understood that each and every composition formula in the incorporated references in specifically incorporated herein as alternative composition formula, including each of the alternative dopant and composition molar or weight percentages (%) as identified therein.

Within the broad field of ceramics and piezoceramies and single crystals or modern single crystals (MSC) there are various illustration conventions, some of which can represent the same thing and may be alternatively used. For a non-limiting invention the phrase 'poled <011>' is understood (used with or without separating commas) to be the same as 'poled [011]' or even 'poled (011)' such that one of skill in the art would recognize these as equivalent convention illustrations and understand their mewling.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:
1. A piezoelectric system, comprising:
at least a first PMN-PT $d_{36}$ structured crystal element, having a crystal composition represented by the formula:

$$x*ABO_3-y*PbTiO_3-(1-x-y)*Pb(Mg_{1/3}Nb_{2/3})O_3$$

wherein, x is defined as molar % 0 to 0.50;
y is defined as molar % 0 to 0.50;
A represents Lead (Pb) or Bismuth (Bi), and
B is represented by the one or more dopant clients selected from:

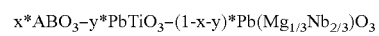

| Zr | Hf | Sn | In | Sc | Tm | Nb | Ta | Zn | Yb | La | Sb |
|----|----|----|----|----|----|----|----|----|----|----|-----|
| Bi | Ma | Ga | Ce | Ni | W  | Cu | Fe | K  | Na | Li | Ba | said at least first crystal element having a cutting direction of one of a X-cut arrangement wherein said X-cut arrangement is a zxt+45° (±20°) cut arrangement and a Y-cut arrangement, wherein said Y-cut arrangement is a zxt-45°(±20°) cut arrangement;

said at least first crystal element prepared by poling along a <011> pseudo-cubic axis of said crystal element and having a poled-bead side and a poled-tail side of said at least first crystal element.

2. The piezoelectric system, according to claim 1, further comprising:
a conductive electrode coating on a pair of Z surfaces of said at least first crystal element on said poled-head side and said poled-tail side; and
at least one conductive lead on said first crystal element.

3. The piezoelectric system, according to claim 2, further comprising:
at least a second said crystal element in a stack arrangement with said at least first crystal element;
said second crystal clement being the other of said one of said X-cut and said Y-cut arrangement;
at least a second respective conductive lead on said at least second crystal element;
a plurality of discrete conductive adhesive pillars bonding respective opposing sides said crystal elements together and providing a conductive connection between opposed said conductive electrode coating; and
said conductive lead bonded between respective first and second crystal elements.

4. The piezoelectric system, according to claim 3, wherein:
a combined total surface area coverage of said discrete conductive adhesive pillars is less than 80% of a surface area of a respective said side of said crystal elements.

5. The piezoelectric system, according to claim 4, wherein:
said combined total surface area coverage of said discrete conductive adhesive pillars is less than 40% of said surface area of a respective said side of said crystal elements.

6. The piezoelectric system, according to claim 5, wherein:
said combined total surface area coverage of said discrete conductive adhesive pillars is less than 20% of said surface area of a respective said side of said crystal elements.

7. The piezoelectric system, according to claim 4, further comprising:
a rigid conductive shim spacing first and second crystal elements in said stack; and
said conductive shim conductively bonded to opposed conductive electrode coatings of said first and second crystal elements.

8. The piezoelectric system, according to claim 3, wherein:
said stack arrangement further comprises at least crystal elements;
said crystal elements in said stack arrangement being selected in an alternating X-cut then Y-cut arrangement;
each said crystal element in said stack arrangement having a respective conductive lead; and
each said crystal element being bonded in said stack by said discrete conductive adhesive pillars.

9. The piezoelectric system, according to claim 3, wherein:
said stack arrangement further comprises at least eight crystal elements;

said crystal elements in said stack arrangement being selected in an alternating X-cut then Y-cut arrangement;
each said crystal clement in said stack arrangement leaving a respective conductive lead; and
each said crystal element being bonded in said stack by said discrete conductive adhesive pillars.

10. The piezoelectric system, according to claim 8, wherein:
each respective pair of said crystal elements in said stack arrangement being arranged in a poled-head side to poled-tail side orientation.

11. The piezoelectric system, according to claim 8, wherein:
each respective pair of said crystal elements in said stack arrangement being arranged in an alternating poled-head side to poled-tail side pair orientation and poled-tail side to poled-head side pair orientation.

12. The piezoelectric system, according to claim 9, wherein:
each respective pair of said crystal elements in said stack arrangement being arranged in a poled-head side to poled-tail side orientation.

13. The piezoelectric system, according to claim 9, wherein:
each respective pair of said crystal elements in said stack arrangement being arranged in an alternating poled-head side to poled-tail side pair orientation and poled-tail side to poled-head side pair orientation.

14. The piezoelectric system, according to claim 3, further comprising;
conductive connectors conductively joining respective said conductive leads of said respective at least first crystal element and said at least second crystal element;
a driving circuit operative for driving said piezoelectric system; and
said conductive connectors operatively connecting respective said crystal elements to said driving circuit.

15. The piezoelectric system, according to claim 10, further comprising:
conductive connectors conductively joining respective said conductive leads of said respective at least alternating X-cut then Y-cut crystal elements;
a driving circuit operative for driving said piezoelectric system; and
said conductive connectors operatively connecting respective said crystal elements to said driving circuit.

16. The piezoelectric system, according to claim 11, further comprising:
conductive connectors conductively joining respective said conductive leads of said respective at least alternating X-cut then Y-cut crystal elements;
a driving circuit operative for driving said piezoelectric system; and
said conductive connectors operatively connecting respective said crystal elements to said driving circuit.

17. The piezoelectric system, according to claim 12, further comprising:
conductive connectors conductively joining respective said conductive leads of said respective at least alternating X-cut then Y-cut crystal elements;
a driving circuit operative for driving said piezoelectric system; and
said conductive connectors operatively connecting respective said crystal elements to said driving circuit.

18. The piezoelectric system, according to claim 13, further comprising:

conductive connectors conductively joining respective said conductive leads of said respective at least alternating X-cut then Y-cut crystal elements;
a driving circuit operative for driving said piezoicectric system; and said conductive connectors operatively connecting respective said crystal elements to said driving circuit.

19. A transducer system, comprising:
a head piece and a tail piece movable relative to each other;
at least two opposed crystal element stack arrangements spacing said head piece from said tail piece in a first orientation;
at least two opposed crystal element stack arrangement spacing said head piece from said tail piece in a second orientation;
said first orientation and said second orientation being perpendicular to each other and operative to secure said tail piece to said head piece during a use of said transducer; and
each said stack arrangement constructed as said stack arrangement in the piezoelectric system according to claim 3.

20. A process for the preparation of a piezoelectric system, comprising the steps of:
mechanically at least a first PMN-PT $d_{36}$ structured crystal element, having a crystal composition represented by the formula:

$$x*ABO_3 - y*PbTiO_3 - (1-x-y)*Pb(Mg_{1/3}Nb_{2/3})O_3$$

wherein, x is defined as molar % 0 to 0.50;
y is defined as molar % 0 to 0.50;
A represents Lead (Pb) or Bismuth (Bi), and
B is represented by the one or more dopant elements selected from:

| Zr | Hf | Sn | In | Sc | Tm | Nb | Ta | Zn | Yb | Lu | Sb |
|----|----|----|----|----|----|----|----|----|----|----|----|
| Bi | Ma | Ga | Ce | Ni | W  | Cu | Fe | K  | Na | Li | Ba | cutting, said at least first crystal element having in a cutting direction of one of a X-cut arrangement wherein said X-cut arrangement is a zxt+45° (±20°) cut arrangement and a Y-cut arrangement, wherein said Y-cut arrangement is a zxt−45°(±20°) cut arrangement;
coating a conductive electrode coating on a pair of Z surfaces of said at least first crystal element;
preparing said at least first crystal element by poling along a <011> pseudo-cubic axis of said crystal element under up to 1500V/mm and defining a poled-head side and a poled-tail side of said at least first crystal element;
applying a plurality of discrete conductive adhesive pillars to less than a total surface are of said crystal element; and
applying a conductive lead on said first crystal element.

21. The process for the preparation of a piezoelectric system, according to claim 20, further comprising the steps of:
preparing at least a second crystal clement as said first crystal element;
selecting, said second crystal element to be the other said cutting direction of said first crystal element creating an X-cut and Y-cut pattern;
positioning said second crystal element on said first crystal element forming a stack arrangement therewith;
said step of positioning including a step of orienting said second crystal element relative to said first crystal element in one of a poled-head side to poled-tail side or poled head-side to poled head-side according to a desired driving level of said stack arrangement; and
joining said first crystal element to said second crystal element by bonding said crystal elements with said discrete conductive adhesive pillars.

22. The process for the preparation of a piezoelectric system, according to claim 21, further comprising the steps of:
preparing at least a third and a fourth crystal element as said first crystal element;
selecting said third and fourth crystal elements to be the other said cutting direction of said first crystal element and said second crystal element creating an X-cut to Y-cut pattern;
positioning said first to fourth crystal elements together forming said stack arrangement therewith;
said step of positioning including a step of orienting respective ones of said crystal element relative to adjacent crystal element in one of a poled-head side to poled-tail side or poled head-side to poled head-side according to a desired driving level of said stack arrangement; and
joining each respective said elements together by bonding said crystal elements with said discrete conductive adhesive pillars.

23. The process for preparation of a piezoelectric system, according to claim 22, further comprising the steps of:
providing an assembly fixture operative to secure said stack arrangement during said step of joining; and
positioning each respective said crystal element in said assembly prior to said step of joining, whereby each assembly fixture maintains an respective alignment of said crystal elements during said step of joining.

* * * * *